United States Patent
Kim et al.

(10) Patent No.: US 9,894,805 B2
(45) Date of Patent: Feb. 13, 2018

(54) HEAT SINK AND MEMORY MODULE HAVING THE SAME

(71) Applicant: Samsung Electronics Co., Ltd., Suwon-si, Gyeonggi-do (KR)

(72) Inventors: Ji-Yong Kim, Suwon-si (KR); Yu-Sung Kim, Seoul (KR); Chung-Hyun Ryu, Hwaseong-si (KR); Sung-Ki Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/229,766

(22) Filed: Aug. 5, 2016

(65) Prior Publication Data

US 2017/0105314 A1    Apr. 13, 2017

(30) Foreign Application Priority Data

Oct. 8, 2015 (KR) .................. 10-2015-0141417

(51) Int. Cl.
| | |
|---|---|
| *H05K 7/20* | (2006.01) |
| *F28D 21/00* | (2006.01) |
| *F28F 3/04* | (2006.01) |
| *F28F 27/00* | (2006.01) |
| *H01L 23/473* | (2006.01) |

(52) U.S. Cl.
CPC ......... *H05K 7/20409* (2013.01); *F28D 21/00* (2013.01); *F28F 3/04* (2013.01); *F28F 27/00* (2013.01); *F28D 2021/0029* (2013.01); *F28F 2215/04* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 5,325,265 A | 6/1994 | Turlik et al. | |
| 2002/0118513 A1* | 8/2002 | Koseki | H01L 23/4093 361/709 |
| 2002/0186545 A1* | 12/2002 | Fukada | H01L 23/473 361/719 |

(Continued)

FOREIGN PATENT DOCUMENTS

| | | | |
|---|---|---|---|
| JP | 5-160307 A | 6/1993 | |
| JP | 5-160308 A | 6/1993 | |

(Continued)

*Primary Examiner* — Anthony Haughton
*Assistant Examiner* — Razmeen Gafur
(74) *Attorney, Agent, or Firm* — Myers Bigel, P.A.

(57) ABSTRACT

A heat sink for a memory module includes a thermally conductive base plate configured to be mounted to a module board underneath the base plate, a plurality of radiation fins protruding upwardly from the base plate, and a pocket cover extending upwardly from an opening that is formed in the base plate to be positioned corresponding to a passive device on the module board, and covering the passive device that protrudes through the opening.

18 Claims, 14 Drawing Sheets

(56) References Cited

U.S. PATENT DOCUMENTS

| | | | |
|---|---|---|---|
| 2003/0076657 A1* | 4/2003 | Summers | H01L 23/4093 361/719 |
| 2004/0130873 A1* | 7/2004 | Hsueh | G06F 1/184 361/697 |
| 2005/0141197 A1* | 6/2005 | Erturk | H01L 23/427 361/700 |
| 2007/0263360 A1* | 11/2007 | Lai | H01L 23/4093 361/719 |
| 2008/0055847 A1* | 3/2008 | Belady | H05K 1/14 361/679.49 |
| 2009/0116195 A1* | 5/2009 | Yang | H01L 23/3675 361/709 |
| 2009/0257197 A1* | 10/2009 | Yang | H01L 23/4093 361/720 |
| 2009/0268408 A1* | 10/2009 | Liu | G06F 1/20 361/710 |
| 2009/0303679 A1* | 12/2009 | Chen | G06F 1/20 361/679.49 |
| 2009/0316352 A1* | 12/2009 | Zhu | G11C 5/04 361/679.54 |
| 2010/0128438 A1* | 5/2010 | Huang | H01L 23/36 361/704 |
| 2010/0134983 A1* | 6/2010 | Rechenberg | H01G 2/08 361/715 |
| 2011/0032672 A1* | 2/2011 | Artman | G06F 1/20 361/679.47 |
| 2011/0299244 A1* | 12/2011 | Dede | F28F 3/046 361/689 |
| 2011/0310565 A1* | 12/2011 | He | G06F 1/20 361/715 |
| 2012/0206880 A1* | 8/2012 | Andres | H01L 23/4275 361/700 |
| 2013/0027889 A1* | 1/2013 | MacAll | H01L 23/4006 361/720 |
| 2013/0188307 A1* | 7/2013 | Mahalingam | F28F 13/02 361/679.46 |
| 2013/0242496 A1* | 9/2013 | Ahmad | H05K 1/141 361/679.31 |
| 2013/0342997 A1* | 12/2013 | Yeh | H01L 23/4093 361/704 |
| 2014/0036435 A1 | 2/2014 | Kim | |
| 2015/0043160 A1* | 2/2015 | Tunks | G06F 1/20 361/679.52 |
| 2015/0137344 A1 | 5/2015 | Mori et al. | |
| 2015/0327353 A1* | 11/2015 | Dickover | H05K 7/2039 361/679.54 |
| 2015/0327394 A1* | 11/2015 | Davis | H01L 23/4006 361/720 |

FOREIGN PATENT DOCUMENTS

| | | |
|---|---|---|
| JP | 5-024716 B1 | 6/2012 |
| JP | 2012-156465 A | 8/2012 |
| KR | 0067869 B | 11/1993 |
| KR | 10-2008-0088964 A | 10/2008 |
| KR | 10-2011-0128408 A | 11/2011 |

* cited by examiner

HEAT SINK AND MEMORY MODULE HAVING THE SAME

CROSS-REFERENCE TO RELATED APPLICATION

This application claims priority under 35 U.S.C. § 119 to Korean Patent Application No. 10-2015-0141417, filed on Oct. 8, 2015 in the Korean Intellectual Property Office (KIPO), the contents of which are herein incorporated by reference in their entirety.

FIELD

Example embodiments relate to a heat sink and a memory module having a heat sink. More particularly, example embodiments relate to a memory module such as a card-type solid state drive (SSD) having a heat sink.

BACKGROUND

A memory module such as a card-type SSD may be connected to a host system through a connector. For example, when the connector of the memory module is inserted into a socket of the host system, impact or vibration may be exerted on electronic elements on the memory module. Because passive devices may have a relatively greater size and may be exposed to the surrounding environment, passive devices may be exposed and/or susceptible to damage from impacts. Further, in the case where a heat sink is coupled on a module board, the passive devices having a relatively greater size may reduce the space for mounting semiconductor devices on the memory module.

SUMMARY

Example embodiments provide a heat sink for a memory module having excellent heat dissipation performance and capable of improving mechanical reliability.

Example embodiments provide a memory module having the heat sink.

Example embodiments provide a card-type SSD having the heat sink.

According to example embodiments, a heat sink for a memory module includes a thermally conductive base plate configured to be mounted on a module board, a plurality of radiation fins protruding upwardly (i.e., outwardly) on the base plate, and a pocket cover extending outwardly from an opening that is formed in the base plate and covering a passive device, on the module board, that protrudes through the opening.

In example embodiments, the pocket cover may include a first portion extending in a first direction (i.e., vertically) from an upper surface of the base plate to cover a side surface of the passive device, and a second portion extending horizontally (i.e., orthogonally relative to the first portion) from the first portion to cover a top surface of the passive device.

In example embodiments, the pocket cover may have an opening or slit that exposes a space beneath the pocket cover to a surrounding environment.

In example embodiments, a recessed portion or dent may be formed in a lower surface of the base plate and is configured to cover an upper portion of a semiconductor device mounted on the module board.

In example embodiments, a height of the pocket cover from an upper surface of the base plate may be the same as or different from a height of the radiation fin.

In example embodiments, the heat sink may further include a cushion pad on an inner surface of the pocket cover that contacts the passive device and cushions the passive device from impact.

In example embodiments, the radiation fins may extend in a first direction and the pocket cover extends in a direction parallel with the first direction.

In example embodiments, the base plate may include a threaded receptacle or screw pin configured to receive a fastener therein for securing the heat sink to the module board.

In example embodiments, the base plate may include a guide that facilitates alignment of the heat sink with the module board.

In example embodiments, the memory module may be a card-type solid state drive.

According to example embodiments, a memory module includes a module board, at least one semiconductor device and at least one passive device mounted on the module board, and a heat sink thermally coupled to the module board. The heat sink includes a thermally conductive base plate covering the module board, a plurality of radiation fins protruding outwardly from the base plate, and a pocket cover extending outwardly from an opening that is formed in the base plate to be positioned corresponding to the at least one passive device on the module board, and covering the at least one passive device that protrudes through the opening.

In example embodiments, the pocket cover may include a first portion extending in a first direction (i.e., vertically) from an upper surface of the base plate to cover a side surface of the passive device, and a second portion extending in a second direction orthogonal to the first direction (i.e., horizontally) from the first portion and configured to cover a top surface of the passive device.

In example embodiments, the pocket cover may have an opening or slit that exposes a space beneath the passive device to a surrounding environment.

In example embodiments, a recessed portion may be formed in a lower surface of the base plate and is configured to cover an upper portion of the semiconductor device.

In example embodiments, the heat sink may further include a cushion pad on an inner surface of the pocket cover that is configured to contact with the passive device and cushion the passive device from impact.

According to example embodiments, a card-type solid state drive (SSD) includes a module board detachably fixed to a host system, non-volatile memory devices, a controller and passive devices respectively disposed on the module board, and a heat sink thermally coupled on the module board. The heat sink includes a thermally conductive base plate having a plurality of radiation fins protruding upwardly thereon, and a pocket cover extending upwardly from an opening that is formed in the base plate and covering the passive device that protrudes through the opening.

In example embodiments, the pocket cover may include a first portion extending vertically from an upper surface of the base plate to cover a side surface of the passive device, and a second portion extending horizontally from the first portion to cover a top surface of the passive device.

In example embodiments, the pocket cover may have an opening or slit for communicating a space receiving the passive device with the surrounding environment.

In example embodiments, a recessed portion or dent may be formed in a lower surface of the base plate to cover an upper portion of the semiconductor device.

In example embodiments, the heat sink may further include a cushion pad on an inner surface of the pocket cover and contacting with the passive device to cushion impact on the passive device.

In example embodiments, the module board may include a connector having connection terminals for connection with the host system.

According to example embodiments, a memory module includes a module substrate and a heat sink. The heat sink includes a thermally conductive base plate configured to be mounted to the module board, a first plurality of radiation fins protruding outwardly from a first portion of the base plate, a second plurality of radiation fins protruding outwardly from a second portion of the base plate, and a pocket cover extending outwardly from an opening formed in the base plate between the first and second portions of the base plate. The pocket cover is configured to cover a passive device, on the module board, that protrudes through the opening.

In example embodiments, a height of the pocket cover from an upper surface of the base plate may be greater than or equal to a height of the first and second plurality of radiation fins.

In example embodiments, a height of the pocket cover from an upper surface of the base plate may be less than a height of the first and second plurality of radiation fins.

In example embodiments, a height of the first plurality of radiation fins from an upper surface of the base plate may be different from a height of the second plurality of radiation fins from the upper surface of the base plate.

In example embodiments, a recessed portion may be formed in a lower surface of at least one of the base plate first and second portions and may be configured to cover an upper portion of a semiconductor device on the module board.

According to example embodiments, a memory module may include a heat sink thermally coupled on a module board and having a plurality of radiation fins. The heat sink may include at least one pocket cover configured for protecting a passive device that protrudes outwardly on the module board from the surrounding environment. Additionally, the heat sink may further include a cushion pad on an inner surface of the pocket cover, and the cushion pad may contact a top surface of the passive device to absorb impact or vibration on the passive device caused from the surrounding environment. Further, the heat sink may have an opening or slit formed in the pocket cover to communicate a receiving space of the pocket cover with the surrounding environment.

Accordingly, the pocket cover for protecting the passive device may be positioned without interfering with the radiation fins, thereby increasing a mounting space for the electronic components and optimizing a size of the heat sink. Further, the cushion pad may absorb the impact or vibration exerted on the passive device, improving reliability and heat dissipation performance of the memory module.

BRIEF DESCRIPTION OF THE DRAWINGS

Example embodiments will be more clearly understood from the following detailed description taken in conjunction with the accompanying drawings.

FIG. 1 is a perspective view illustrating a memory module having a heat sink in accordance with example embodiments.

FIG. 2 is a partially exploded perspective view illustrating the memory module in FIG. 2.

FIG. 3 is a plan view illustrating the memory module in FIG. 1.

FIG. 4 is a cross-sectional view taken along the line A-A' in FIG. 3.

FIG. 5 is a cross-sectional view taken along the line B-B' in FIG. 3.

FIG. 6 is a plan view illustrating a module board of the memory module in FIG. 1.

FIG. 7 is a perspective view illustrating the heat sink in accordance with example embodiments.

FIG. 8 is a rear perspective view illustrating the heat sink in FIG. 7.

FIG. 9 is a plan view illustrating the heat sink in FIG. 7.

FIG. 10 is a cross-sectional view taken along the C-C' line in FIG. 9.

FIG. 11 is a cross-sectional view taken along the D-D' line in FIG. 9.

FIGS. 12 to 18 are cross-sectional views illustrating a heat sink in accordance with example embodiments.

FIG. 19 is a block diagram illustrating an electronic device in accordance with example embodiments.

DETAILED DESCRIPTION OF EXAMPLE EMBODIMENTS

Figure 1:
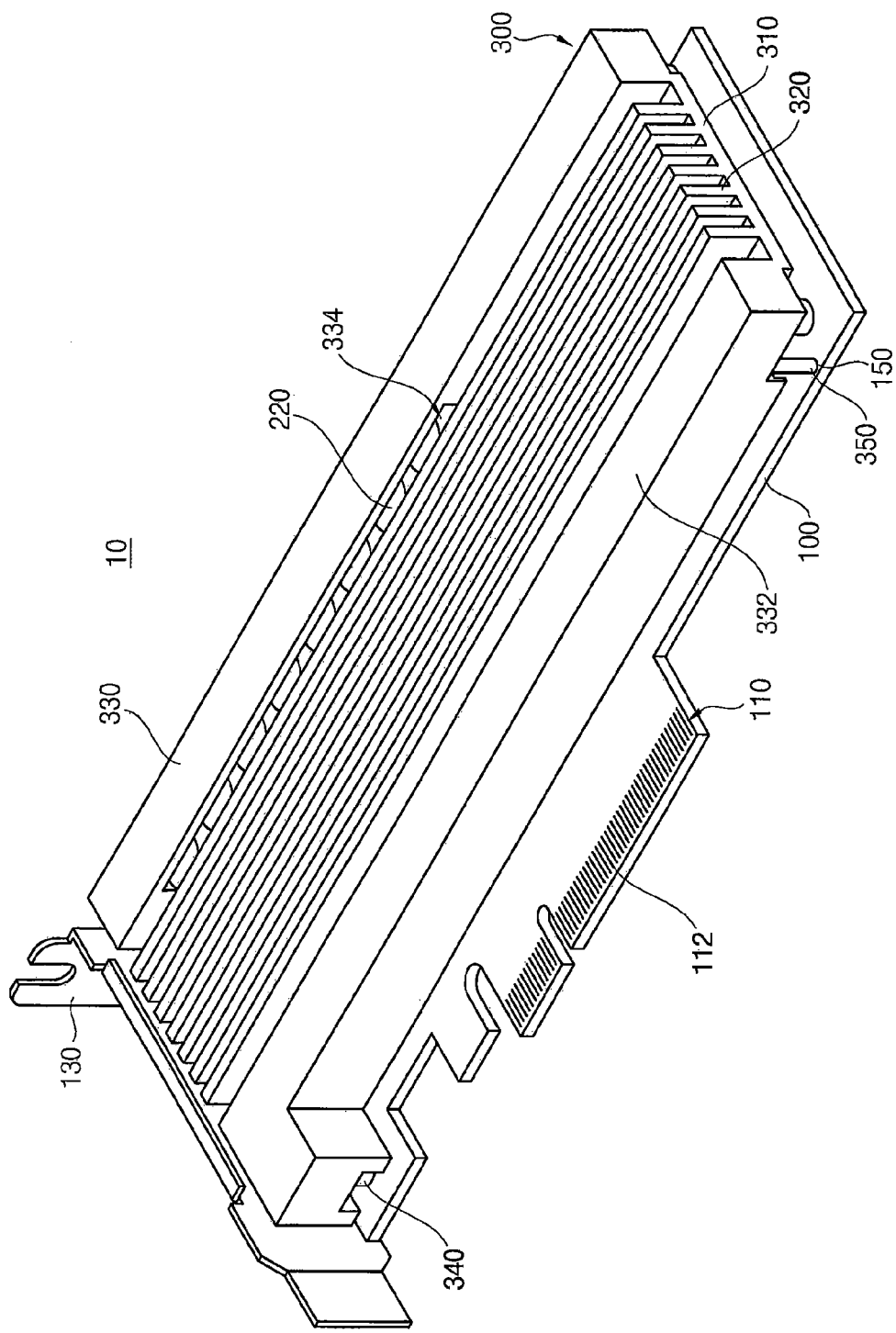
FIGS. 1 to 19 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of components or elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
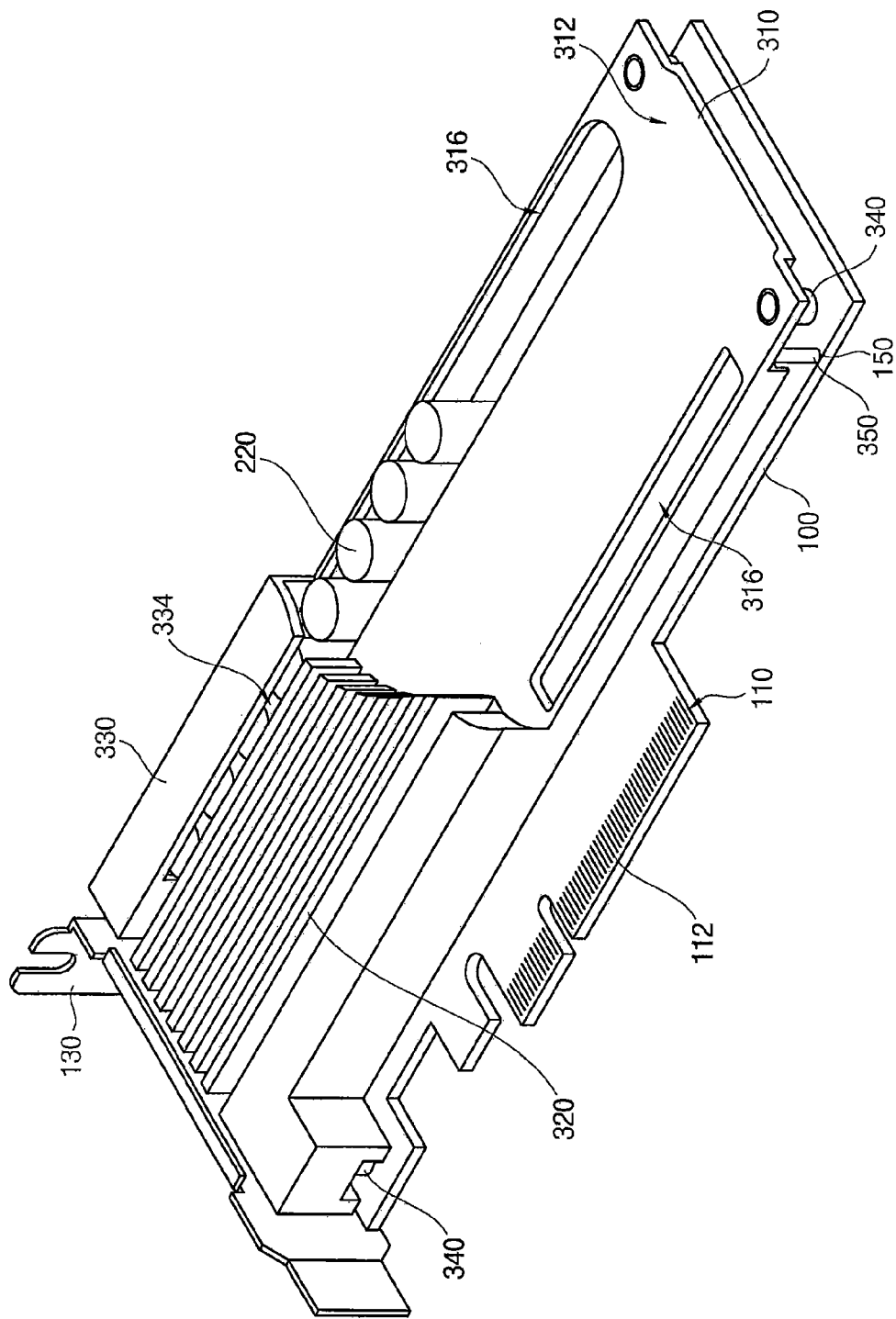
Figure 3:
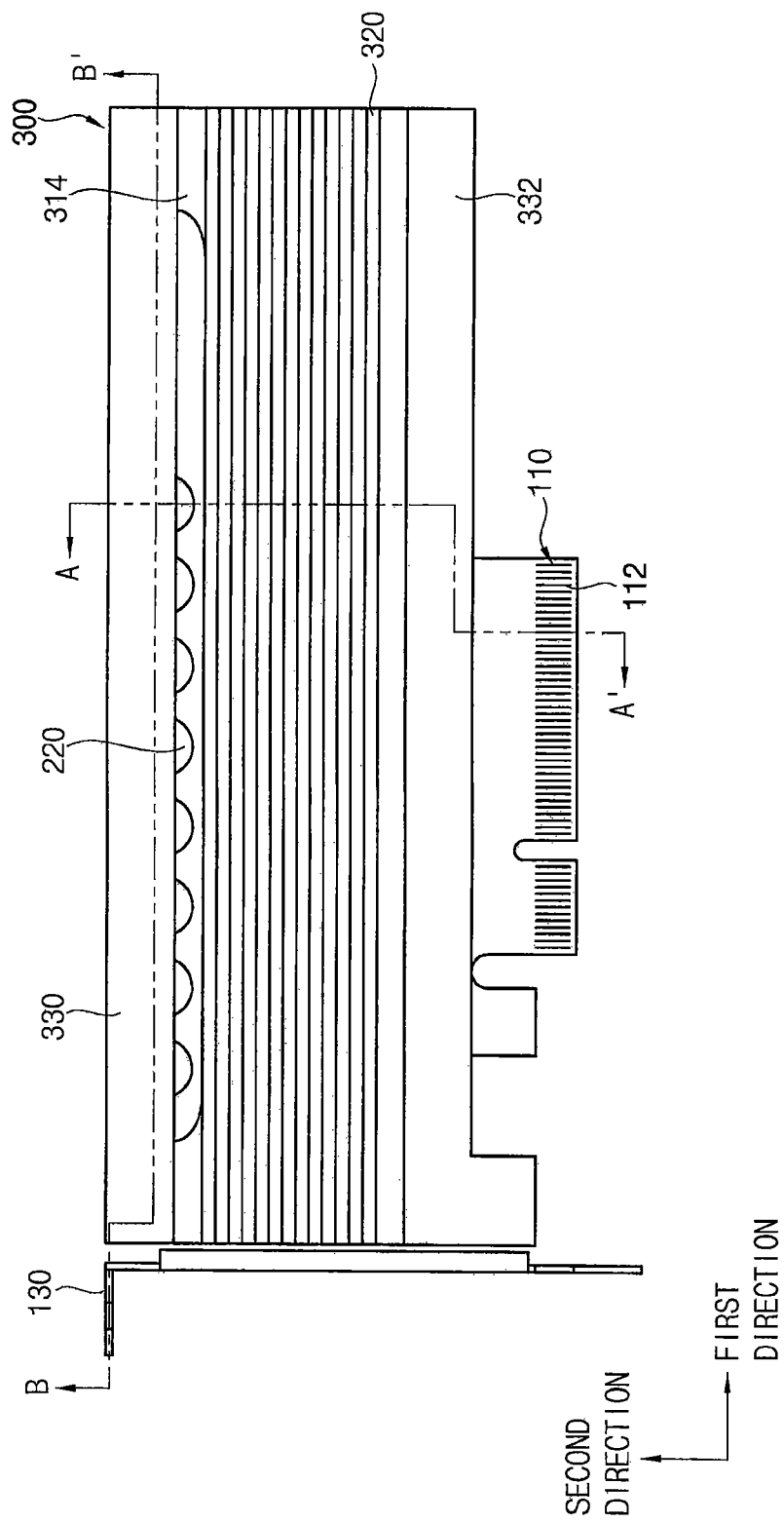
Figure 4:
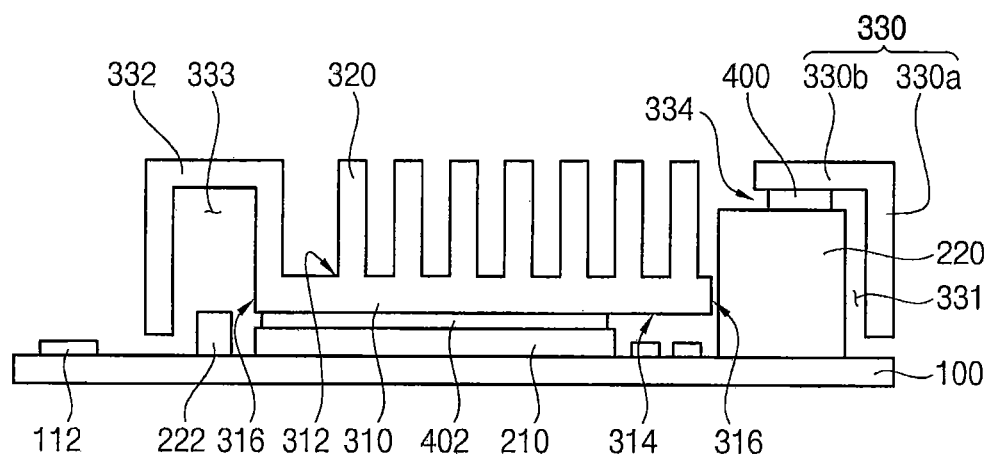
Figure 5:
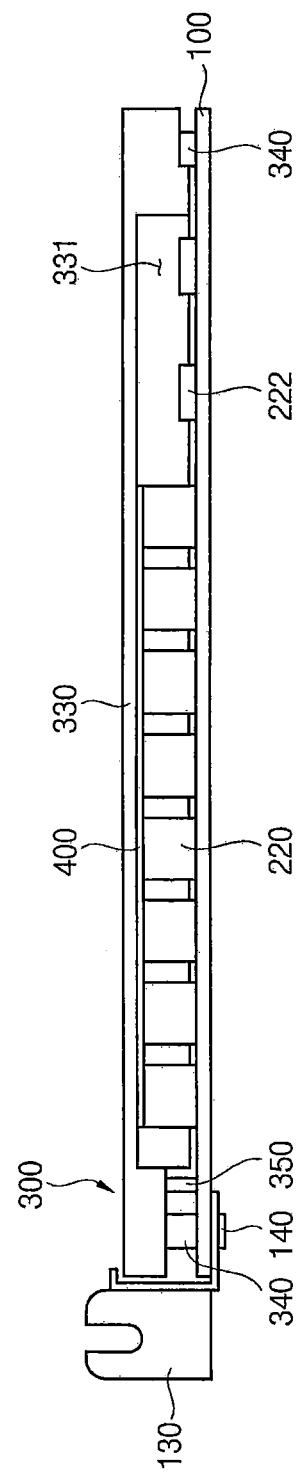
Figure 6:
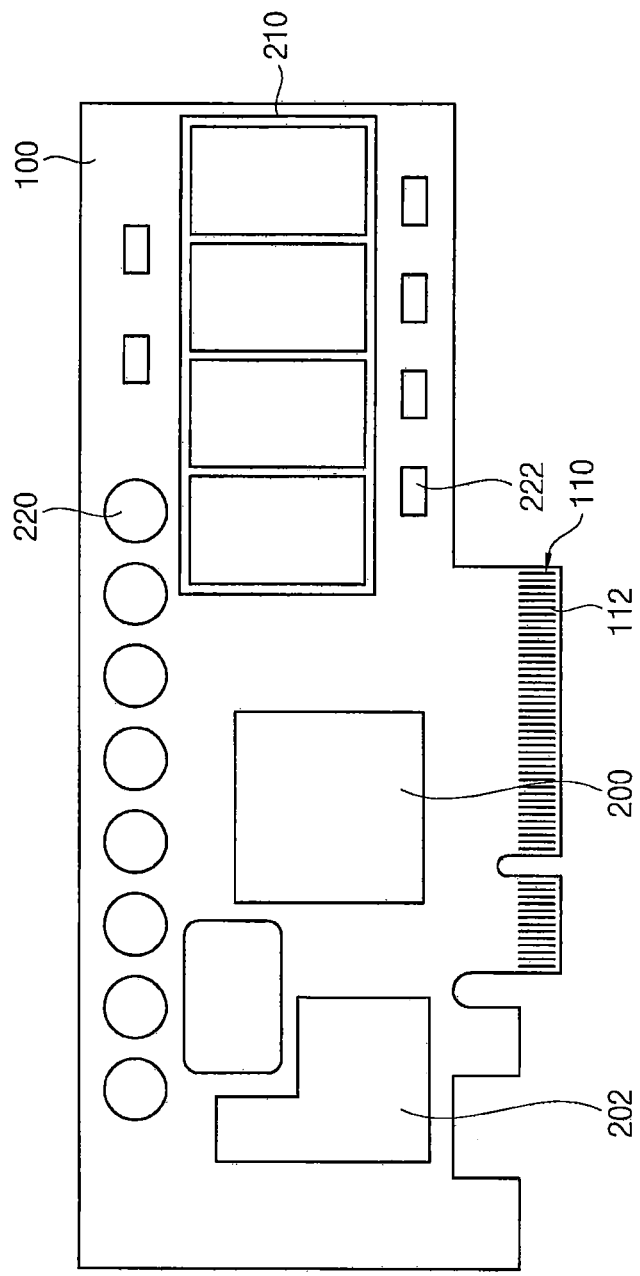

FIG. 1 is a perspective view illustrating a memory module having a heat sink in accordance with example embodiments. FIG. 2 is a partially exploded perspective view illustrating the memory module in FIG. 2. FIG. 3 is a plan view illustrating the memory module in FIG. 1. FIG. 4 is a cross-sectional view taken along the line A-A' in FIG. 3. FIG. 5 is a cross-sectional view taken along the line B-B' in FIG. 3. FIG. 6 is a plan view illustrating a module board of the memory module in FIG. 1.

Referring to FIGS. 1 to 6, a memory module 10 may include a module board 100, semiconductor devices 200, 202, 210 and passive devices 220, 222 disposed on the module board 100, and a heat sink 300 thermally coupled on the module board 100.

In example embodiments, the module board 100 may be a single-layered or multi-layered circuit substrate having an upper surface and a lower surface opposite to each other. For example, the module board 100 may be a printed circuit board (PCB). The PCB may include wirings and vias connected to the wirings. The wirings may include printed circuit patterns for interconnecting with the semiconductor devices 200, 202, 210 and the passive devices 220, 222.

In example embodiments, the semiconductor devices may include an SSD controller 200, non-volatile memory devices 210 and a buffer memory device 202. The module board 100 may have a rectangular or square shape. The semiconductor devices may be mounted on the module board 100 such that the memory module 10 may be provided as a solid state drive (SSD). The SSD may be used to replace a hard disk in a PC, notebook, etc. The SSD may be used in a mobile device such as smart phone, tablet PC, digital camera, MP3 player, PDA, etc.

A connector 110 having connection terminals for connection with a host system (not illustrated) may be provided in a first side portion of the module board 100. The connector 110 may be formed to protrude outwardly from the first side portion of the module board 100. The connector 110 of the of the module board 100 may be inserted into a circuit board socket of the host system. The circuit board socket may have a female connector. Accordingly, the memory module 10 may be electrically connected to the host system by the connection terminals 112 of the connector 110.

The SSD controller 200 may be positioned adjacent to the connector 110 on the upper surface of the module board 110. When viewed in the plan view of FIG. 6, the SSD controller 200 may be positioned in the middle region of the module board 100.

The SSD controller 200 may communicate a signal with the host using a host interface. The host interface may include a universal serial bus (USB), a small computer system interface (SCSI), a PCI express, an ATA, a parallel ATA, a serial ATA, a serial attached SCSI, etc. In here, the signal communicated between the SSD controller 200 and the host may include a command, an address, data, etc. The SSD controller 200 may analyze and process the signal inputted from the host.

A bracket 130 for installing to the host system may be provided in a second side portion of the module board 100 adjacent to the first side portion. The bracket 130 may be connected to the module board 100 by a fastening member, e.g., a fixing bolt. An end portion of the bracket 130 may include a fastening portion for fixing with the host system. Accordingly, the memory module 10 may be detachably fixed to the host system using the bracket 130. For example, the memory module 10 may be a PCIe card-type SSD.

A plurality of the non-volatile memory devices 210 may be positioned adjacent to a third side portion opposite to the second side portion on the upper surface of the module board 100. When viewed in the plan view of FIG. 6, the non-volatile memory devices 210 may be positioned in the right side of the module board 100. Although it is not illustrated in the figures, the non-volatile memory devices may be additionally disposed on the lower surface of the module board 100.

The non-volatile memory devices 210 may be used as a storage medium of the SSD. For example, the non-volatile memory device 210 may include NAND flash memories. The non-volatile memory devices 210 may be connected to the SSD controller 200 through at least one channel CH. The SSD may use non-volatile memories such as PRAM, MRAM, ReRAM, FRAM, etc. as a storage medium in place of flash memory.

The buffer memory device 202 may be positioned adjacent to the SSD controller 200 on the upper surface of the module board 100. The buffer memory device 202 may be positioned adjacent to the second side portion on the upper surface of the module board 100. When viewed in the plan view of FIG. 6, the buffer memory device 202 may be positioned in the left side of the module board 100.

The buffer memory device 202 may be used as a buffer area temporarily storing data received from the host or temporarily storing data read from the non-volatile memory devices 210. Additionally, the buffer memory device 202 may be used to drive software S/W used for an effective management of the non-volatile memory devices 210. Further, the buffer memory device 202 may be used to store meta data received from the host and/or may be used to store cache data.

For example, the buffer memory device 202 may include at least one DRAM package. The DRAM package may include a package substrate and at least one DRAM chip mounted on the package substrate. The SSD may be embodied by replacing the DRAM with volatile memories such as SRAM, etc. or non-volatile memories such as flash memory, FRAM, MRAM, ReRAM, FRAM, etc.

The memory module 10 may further include a power management IC (PMIC) (not illustrated) for adjusting a power applied to the electronic elements.

In example embodiments, the passive devices may be disposed on the upper surface of the module board 100. The passive device may include capacitors 220, resistors 222, etc. For example, a plurality of the capacitors 220 may be positioned adjacent to the second side portion of the module board 100 and may be arranged along a peripheral region of a fourth side portion of the module board 100 opposite to the first side portion. The resistors 222 may be arranged along the first side portion and the fourth side portion.

In example embodiments, the heat sink 300 may be thermally coupled to the module board 100 to cover most of the upper surface of the module board 100. The module board 100 may be detachably installed to a lower surface of the heat sink 300.

In particular, the heat sink 300 may include a thermally conductive base plate 310 covering the upper surface of the module board 100, a plurality of radiation fins 320 protruding upwardly on the base plate 310, and at least one pocket cover 330, 332 extending upwardly from an opening formed in the base plate 310 to form at least one pre-defined receiving space 331, 333.

The base plate 310 may have a rectangular or square shape corresponding to the module board 100. The base plate 310 may cover the substantially entire upper surface of the module board 100. Only the connector 110 protruding from the first side portion of the module board 100 may be exposed from the base plate 310.

The base plate 310 may include a metal having a high thermal conductivity coefficient. For example, the base plate 310 may include aluminum or an aluminum alloy. A lower surface 314 of the base plate 310 may be in thermal contact with the upper surface of the module board 100. That is, the base plate 10 may be in direct or indirect contact with the semiconductor devices on the module board 100 to dissipate heat generated from the semiconductor devices.

A plurality of the radiation fins 320 may protrude upwardly from an upper surface 312 of the base plate 310. The radiation fins 320 protruding upwardly on the base plate 310 may provide a larger surface area to the surrounding environment to dissipate heat from the module board 100 to the surrounding atmosphere. The radiation fins 320 may have any geometric or structural configuration for facilitating heat dissipation.

The radiation fins 320 may extend in a first direction. The radiation fins 320 may be spaced apart from each other in a second direction substantially perpendicular to the first direction. Alternatively, some of the radiation fins may extend in the first direction and others of the radiation fins may extend a direction different from the first direction, e.g., a second direction. Additionally, a first portion of the radiation fins may extend in the first direction and a second portion of the radiation fins opposite to the first portion may extend in the different direction, e.g., the second direction. It may be understood that the extending directions, spacing distances, the number of the radiation fins, etc., may not be limited thereto.

The base plate 310 may have at least one opening 316 positioned corresponding to the passive devices 220, 222 and configured to expose the passive devices 220, 222 on the illustrated embodiments, a height of the capacitor 220 from the upper surface of the module board 100 may be greater than that of the upper surface 312 of the base plate 310. Accordingly, the capacitors 220 may extend upwardly from the upper surface of the module board 100 to protrude through the opening 316.

The pocket covers 330, 332 may protrude upwardly from the upper surface 312 of the base plate 310. In particular, the pocket covers 330, 332 may cover the passive device 220 that extends upwardly and protrudes through the opening 316, such as capacitor 220 in FIG. 4. A first pocket cover 330 may include a vertical extending portion 330a and a horizontal extending portion 330b. The vertical extending portion 330a may extend vertically from the upper surface 312 of the base plate 310 to cover side surfaces of the passive devices 220. The horizontal extending portion 330b may extend horizontally from an end portion of the vertical extending portion 330a to cover top surfaces of the passive devices 220.

The first pocket cover 330 may extend in the first direction along the fourth side portion of the module board 100. The second pocket cover 332 may extend in the first direction along the first side portion of the module board 100. The first pocket cover 330 may have a first receiving space 331 receiving an upper portion of the passive device 220. The second pocket cover 332 may have a second receiving space 333. Accordingly, the first receiving space 331 and the second receiving space 333 may have a recess shape extending in the first direction. The recesses of the first receiving space 331 and the second receiving space 333 may be formed to have a depth corresponding to at least a height of the radiation fins 320.

The first pocket cover 330 may have an open slit 334 for connecting the first receiving space 331 with the surrounding environment. The open slit 334 may extend in the first direction. Side portions of the passive devices (e.g., capacitor) 220 covered by the first pocket cover 330 may be partially exposed through the open slit 334.

A plurality of the radiation fins 320 and the pocket covers 330, 332 may be formed integrally with the base plate 310. For example, the heat sink 300 may be molded as a unitary body. Accordingly, the heat sink 300 including a metal such as aluminum may be a cooling means for dissipating heat from electronic elements on the module board 100 to the outside.

In an example embodiment, the heat sink 300 may further include a cushion pad 400 on an inner surface of the first pocket cover 330. The cushion pad 400 may extend in the first direction on the inner surface of the first pocket cover 330. The cushion pad 400 may be interposed between the top surface of the passive device (e.g., capacitor) 220 and the inner surface of the first pocket cover 330. The cushion pad 400 may contact with the top surface of the passive device 220 to cushion impact on the passive device 220 from the surrounding environment.

The cushion pad may include a thermal interface material. Examples of thermal interface material that may be utilized in accordance with embodiments may include thermally conductive adhesive tape, thermally conductive grease, thermally conductive interface pad, thermally conductive adhesive, etc.

Additionally, the heat sink 300 may further comprise a dissipation pad 402 interposed between the lower surface 314 of the base plate 310 and a top surface of the semiconductor device, e.g., non-volatile memory device 210. The dissipation pad may include a thermal interface material. As described above, examples of the thermal interface material may include thermally conductive adhesive tape, thermally conductive grease, thermally conductive interface pad, thermally conductive adhesive, etc.

In example embodiments, the heat sink 300 may further include threaded receptacles or screw pins 340 positioned in corners thereof and configured for combining with the module board 100. The module board 100 may be fixed to the lower surface 314 of the base plate 310 by threaded fasteners or bolts 140 threadingly engaged with the screw pins 340. The screw pins 340 may protrude from the lower surface 314 of the base plate 310 by a predetermined distance. The module board 100 may be spaced apart from the lower surface 314 of the base plate 310 by the protruding distance of the screw pins 340.

Additionally, the heat sink 300 may further include guide pins 350 positioned in corners thereof. A pair of the guide pins 350 may be disposed diagonally to each other. The guide pins 350 may protrude from the lower surface 314 of the base plate 310 by a predetermined distance. When the module board 100 is combined with the heat sink 300, the guide pins 350 may be inserted slidingly into alignment holes 150 in the module board 100. Accordingly, the guide pins 350 may guide the module board 100 to a desired alignment position, and thus, damage to the electronic elements on the module board 100 may be prevented by the heat sink 300.

Further, although it is not illustrated in the figures, the memory module 10 may further include a plurality of the module boards stacked on one another. Semiconductor devices may be mounted on the module boards respectively.

As mentioned above, the memory module 10 provided as card-type SSD may include the heat sink 300 thermally coupled on the module board 100 and having a plurality of the radiation fins 320. The heat sink 300 may include the pocket covers 330, 332 configured for protecting the passive devices 220, 222 protruding on the module board 100 from the surrounding environment. Additionally, the heat sink 300 may further include the cushion pad 400 on the inner surface of the first pocket cover 330, and the cushion pad 400 may contact the top surface of the passive device (e.g., capacitor) 220 to absorb impact or vibration on the passive device (i.e., capacitor) 220 caused from the surrounding environment. Further, the heat sink 300 may further include an open slit 334 formed in the first pocket cover 330 to communicate the receiving space with the surrounding environment.

Accordingly, the first pocket cover 330 for protecting the passive device 220 may be formed to be positioned without interfering with the radiation fins 320, thereby increasing a mounting space for the electronic components and optimizing a size of the heat sink 300. Further, the cushion pad 400 may absorb the impact or vibration exerted on the passive device (i.e., capacitor) 220, improving reliability and heat dissipation performance of the memory module.

Hereinafter, the heat sink in FIG. 1 will explained in detail.

Figure 7:
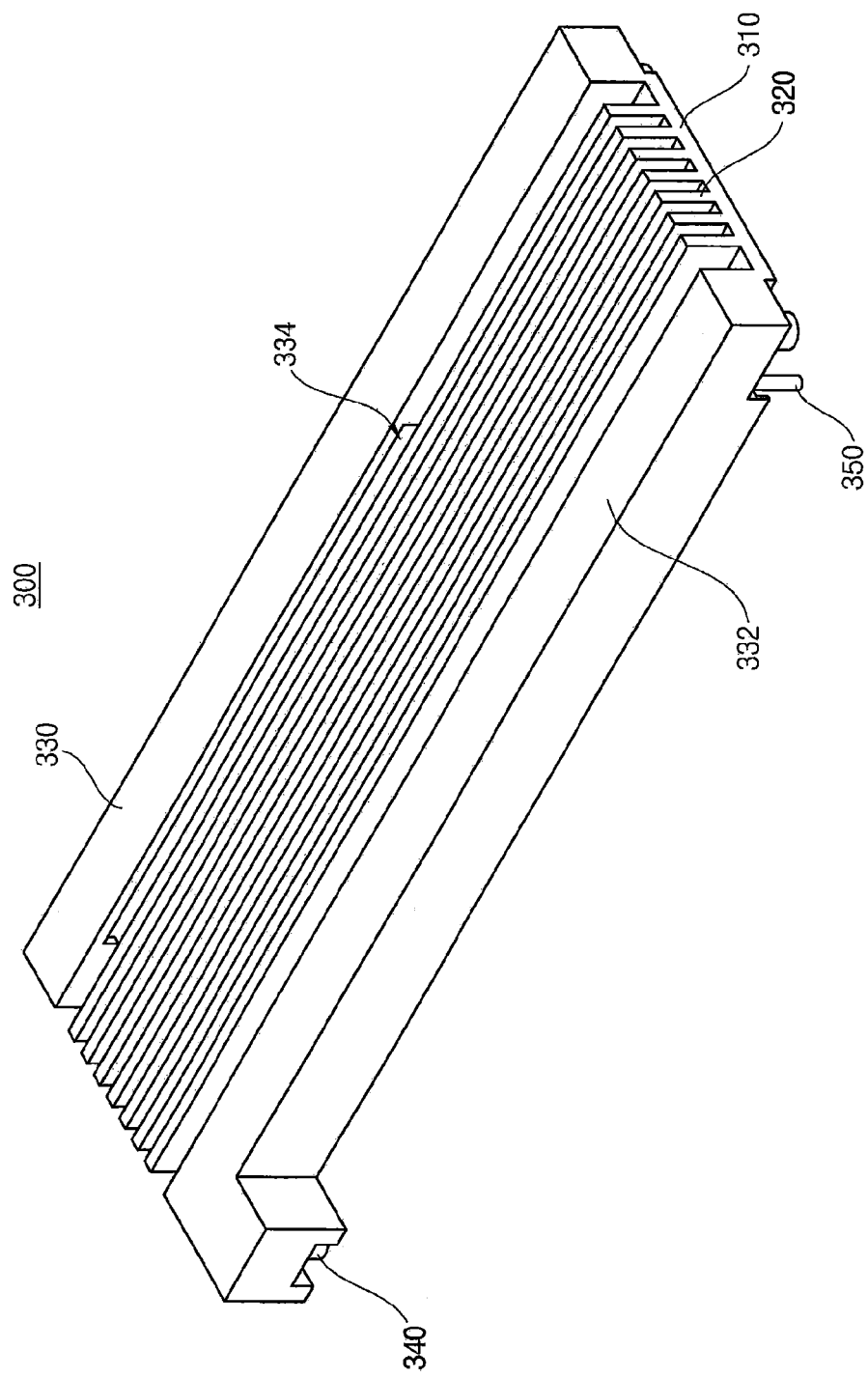
Figure 8:
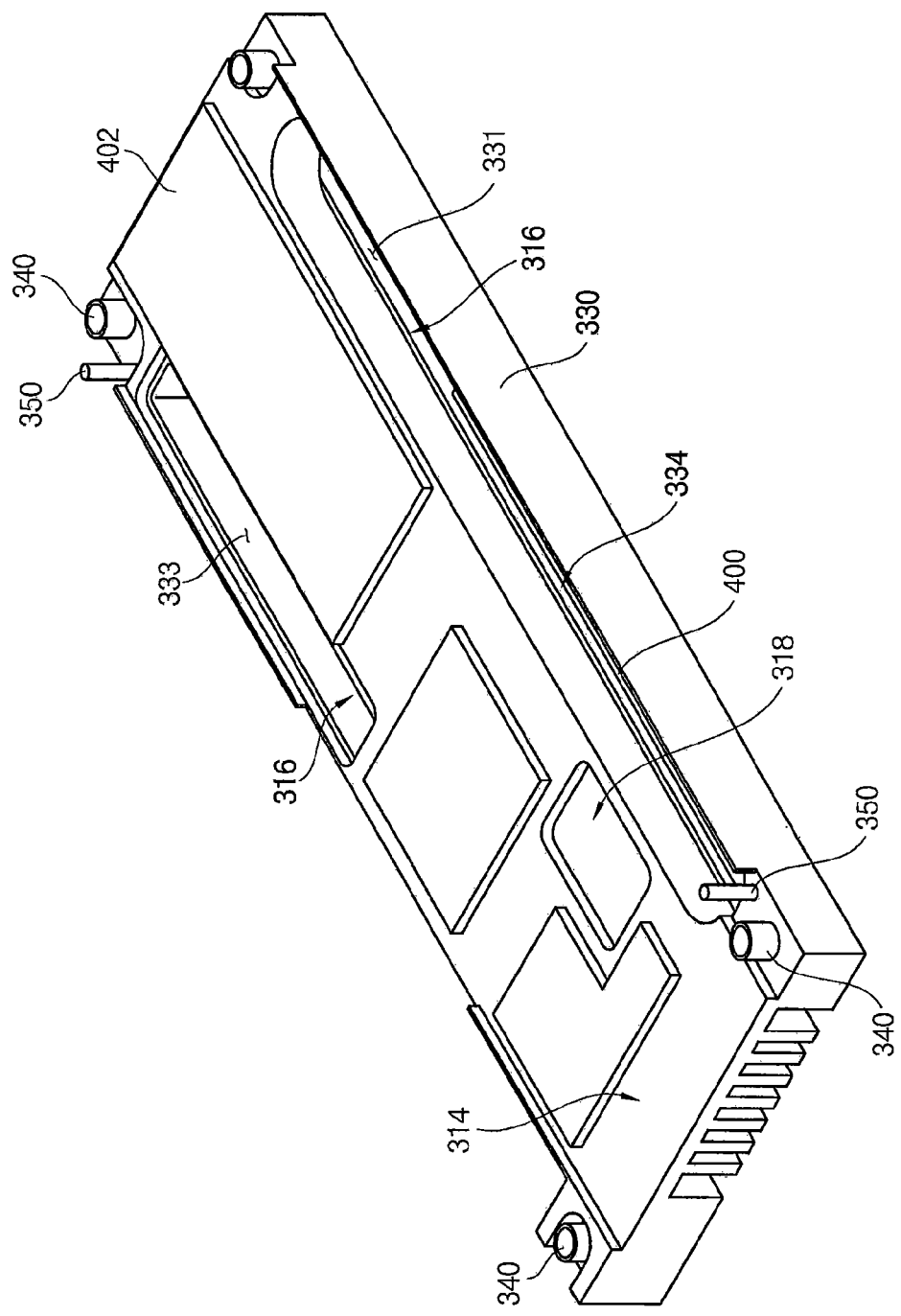
Figure 9:
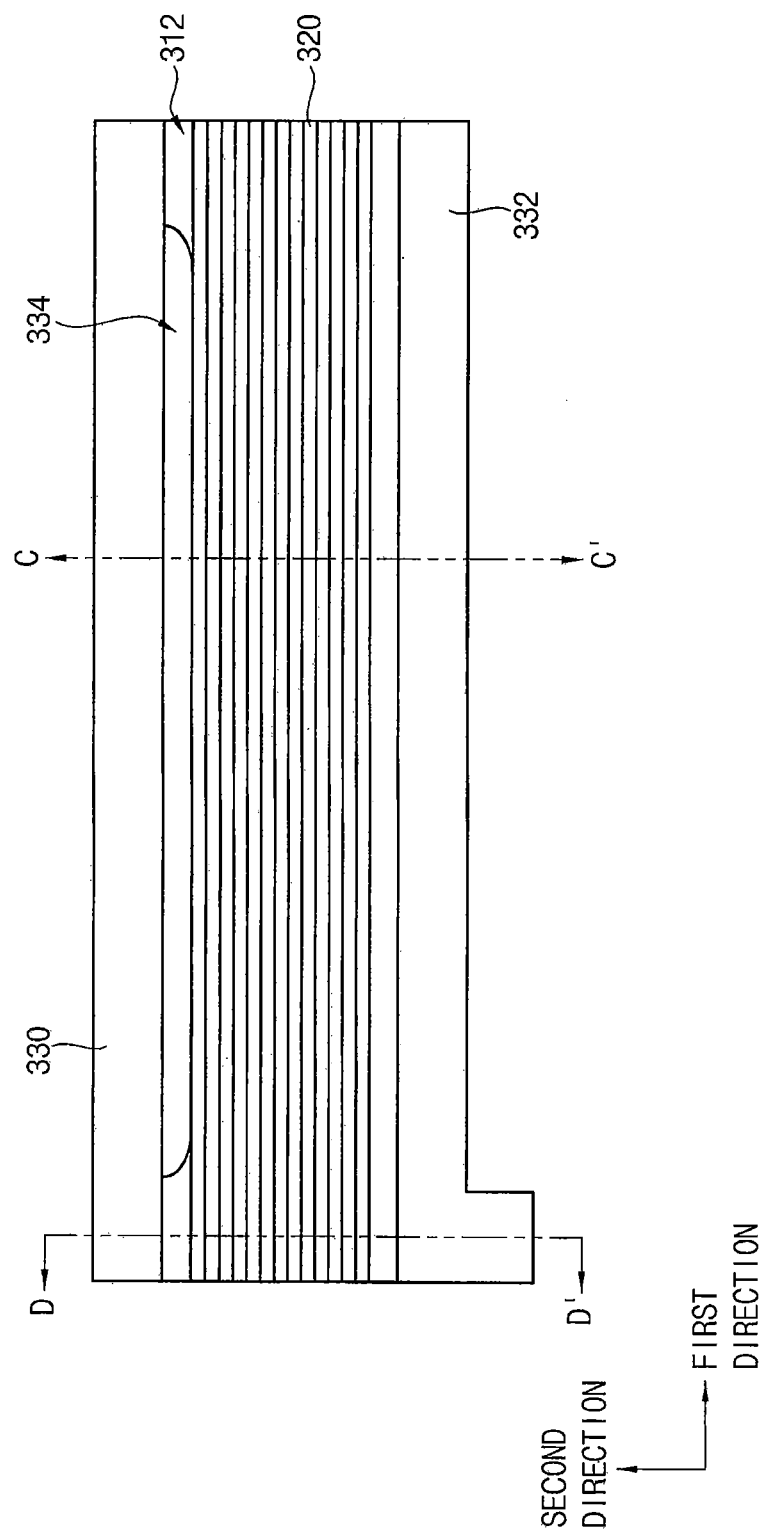
Figure 10:
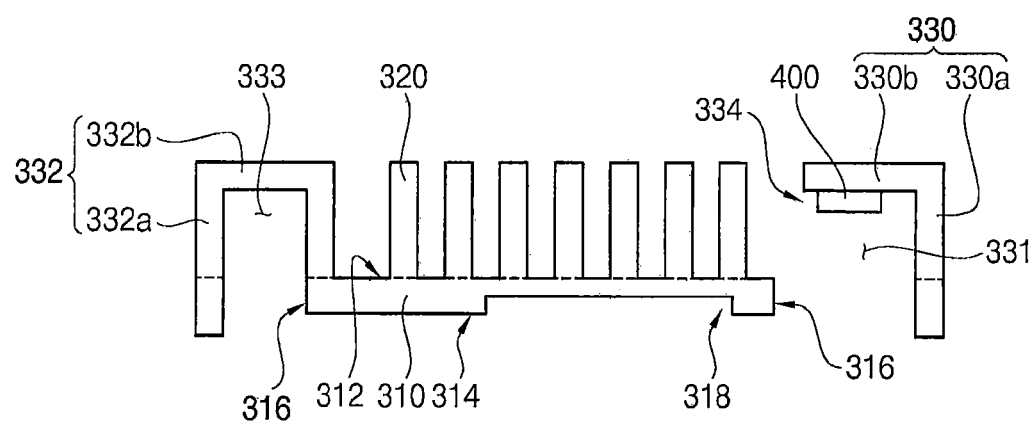
Figure 11:
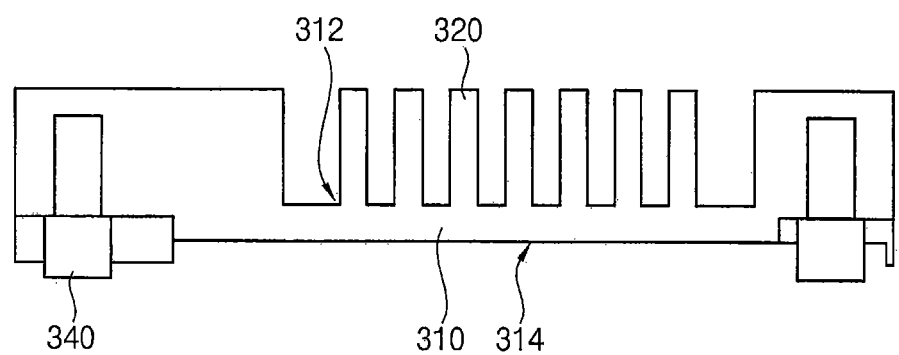

FIG. 7 is a perspective view illustrating the heat sink in accordance with example embodiments. FIG. 8 is a rear perspective view illustrating the heat sink in FIG. 7. FIG. 9 is a plan view illustrating the heat sink in FIG. 7. FIG. 10 is a cross-sectional view taken along the C-C' line in FIG. 9. FIG. 11 is a cross-sectional view taken along the D-D' line in FIG. 9.

Referring to FIGS. 7 to 11, the heat sink 300 may include a thermally conductive base plate 310, a plurality of radiation fins 320 protruding upwardly on the base plate 310, and at least one pocket cover 330, 332 extending upwardly from an opening formed in the base plate 310 to form at least one receiving space 331, 333 having a depth corresponding to a height of the radiation fins 320.

In example embodiments, the base plate 310 may have a rectangular or square shape corresponding to a module board attached to a lower surface of the base plate 300. The base plate 310 may include a metal having a high thermal conductivity coefficient. For example, the base plate 310 may include aluminum or an aluminum alloy.

The plurality of radiation fins 320 may protrude upwardly from an upper surface 312 of the base plate 310. The radiation fins 320 may extend in a first direction. The radiation fins 320 may be spaced apart from each other in a second direction substantially perpendicular to the first direction.

Alternatively, some of the radiation fins 320 may extend in the first direction and others of the radiation fins 320 may extend a direction different from the first direction, e.g., the second direction. Additionally, a first portion of the radiation fins 320 may extend in the first direction and a second portion of the radiation fins 320 opposite to the first portion may extend in the different direction, e.g., the second direction. It may be understood that the extending directions, spacing distances, the number of the radiation fins, etc., may not be limited thereto.

The base plate 310 may have at least one opening 316 positioned corresponding to the passive devices 220, 222 and configured to expose the passive devices. For example, as shown in FIGS. 2 and 4, a height of the passive device (i.e., a capacitor) 220 from an upper surface of the module board 100 may be greater than that of the upper surface 312 of the base plate 310, and thus, the passive device (i.e., capacitor) 220 may protrude upwardly from the upper surface of the module board 100 through the opening 316. The pocket covers 330, 332 may cover the passive device that protrudes upwardly through the opening 316.

In particular, the first pocket cover 330 may extend in a first direction along a first side portion of the base plate 310. The second pocket cover 332 may extend in the first direction along the second side portion of the base plate 310 opposite to the first side portion.

The first pocket cover 330 may include a first vertical extending portion 330*a* and a first horizontal extending portion 330*b*. The first vertical extending portion 330*a* may extend vertically from the upper surface 312 of the base plate 310 to cover a side surface of the passive device, e.g., the capacitor. The first horizontal extending portion 330*b* may extend horizontally from an end portion of the first vertical extending portion 330*a* to cover a top surface of the passive device. The first pocket cover 330 may have a first receiving space 331 receiving an upper portion of the passive device that protrudes through the opening 316 of the base plate 310. The first pocket cover 330 may have a depth to at least a height of the radiation fins 320 and may have a recess providing the first receiving space 331.

The second pocket cover 332 may have a second vertical extending portion 332*a* and a second horizontal extending portion 332*b*. The second vertical extending portion 332*a* may extend vertically from the upper surface 312 of the base plate 310. The second horizontal extending portion 332*b* may extend horizontally from an end portion of the second vertical extending portion 332*a*. The second pocket cover 332 may have a depth to at least the height of the radiation fins 320 and may have a recess providing a second receiving space 333.

The first pocket cover 330 may have an open slit 334 for connecting the first receiving space 331 with the surrounding environment. The open slit 334 may extend in the first direction. A side portion of the passive device covered by the first pocket cover 330 may be partially exposed through the open slit 334 to the surrounding environment.

Additionally, a recessed portion or dent 318 may be formed in a lower surface of the base plate 320 to cover an upper portion of a semiconductor device mounted on the module board. The dent 318 may have a predetermined depth from the lower surface 314 of the base plate 320.

In an example embodiment, the heat sink 300 may further include a cushion pad 400 on an inner surface of the first pocket cover 330. The cushion pad 400 may extend in the first direction on the inner surface of the first pocket cover 330. The cushion pad 400 may be interposed between the top surface of the passive device and the inner surface of the first pocket cover 330. The cushion pad 400 may contact with the top surface of the passive device to cushion impact or vibration on the passive device caused from the surrounding environment.

The cushion pad may include a thermal interface material. Examples of the thermal interface material may include thermally conductive adhesive tape, thermally conductive grease, thermally conductive interface pad, thermally conductive adhesive, etc.

Additionally, the heat sink 300 may further comprise a heat dissipation pad 402 on the lower surface 314 of the base plate 310. Although it is not illustrated in the figures, the heat dissipation pad 402 may be provided on an inner surface of the dent 318. The heat dissipation pad 402 may contact a semiconductor device mounted on the module board to efficiently transfer heat to the heat sink 300. The heat dissipation pad 402 may include a thermal interface material. Examples of the thermal interface material may include thermally conductive adhesive tape, thermally conductive grease, thermally conductive interface pad, thermally conductive adhesive, etc.

In example embodiments, the heat sink 300 may further include screw pins 340 positioned in corners thereof and configured for securing the heat sink 300 to the module board. The module board 100 may be secured to the lower surface 314 of the base plate 310 by bolts (not illustrated) screwed into the screw pins 340. The screw pins 340 may protrude from the lower surface 314 of the base plate 310 by a predetermined distance. The module board may be spaced apart from the lower surface 314 of the base plate 310 by the protruding distance of the screw pins 340.

Additionally, the heat sink 300 may further include guide pins 350 positioned in corners thereof. A pair of the guide pins 350 may be disposed diagonally to each other, for example. The guide pins 350 may protrude from the lower surface 314 of the base plate 310 by a predetermined distance. When the module board 100 is combined with the heat sink 300, the guide pins 350 may be inserted slidingly into alignment holes in the module board. Accordingly, the guide pins 350 may guide the module board to a desired alignment position, and thus, damage to the electronic elements on the module board may be prevented by the heat sink 300 secured thereto.

Further, although it is not illustrated in the figures, the heat sink 300 may further include an electromagnetic shielding layer for electromagnetic shielding. For example, the electromagnetic shielding layer may be provided within the base plate 300 or on a surface of the base plate 300.

FIGS. 12 to 18 are cross-sectional views illustrating a heat sink in accordance with example embodiments. The heat sinks may be similar to the heat sink 300 described with reference to FIGS. 7 to 11. Thus, same reference numerals will be used to refer to the same or like elements, and any further repetitive explanation concerning the above elements will be omitted.

Figure 12:
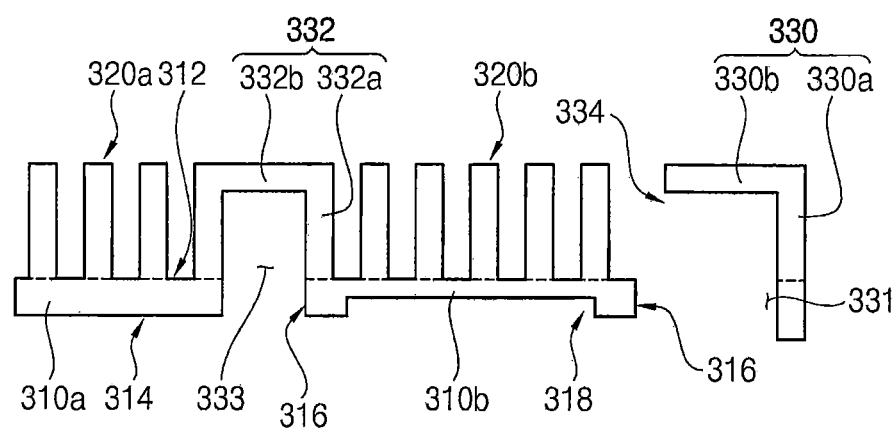

Referring to FIG. 12, a base plate may include a first base 310a and a second base 310b spaced apart from each other. A first group of radiation fins 320a may be disposed on the first base 310a and a second group of radiation fins 320b may be disposed on the second base 310b.

A first pocket cover 330 may be arranged in a peripheral region of the base plate, and a second pocket cover 332 may be arranged in a middle region of the base plate. The second pocket cover 332 may extend upwardly from an opening 316 formed between the first base 301a and the second base 310b. The second pocket cover 332 may be positioned between the first group of radiation fins 320a and the second group of radiation fins 320b.

In some embodiments, the second base 310b may have a greater area than the first base 310a. In some embodiments, the number of the second group of radiation fins 320b may be greater than the number of the first group of radiation fins 320a.

Figure 13:
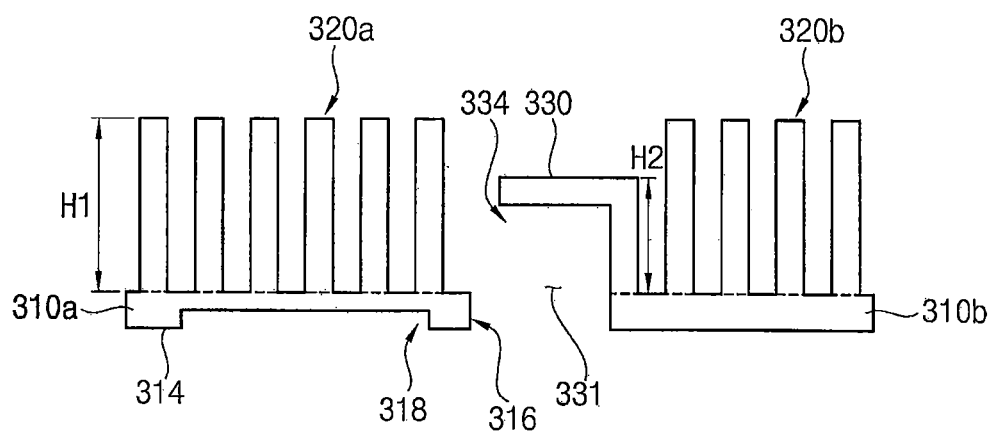

Referring to FIG. 13, a first group of radiation fins 320a may be disposed on a first base 310a and a second group of radiation fins 320b may be disposed on a second base 310b. A pocket cover 330 may extend upwardly from an opening 316 formed between the first base 310a and the second base 310b. The pocket cover 330 may be positioned between the first group of radiation fins 320a and the second group of radiation fins 320b. An upper surface of the first base 310a may be coplanar with an upper surface of the second base 310b.

The radiation fins 320a may have a first height H1 from the upper surface of the first base 310a, and the pocket cover 330 may have a second height H2 less than the first height H1.

Figure 14:
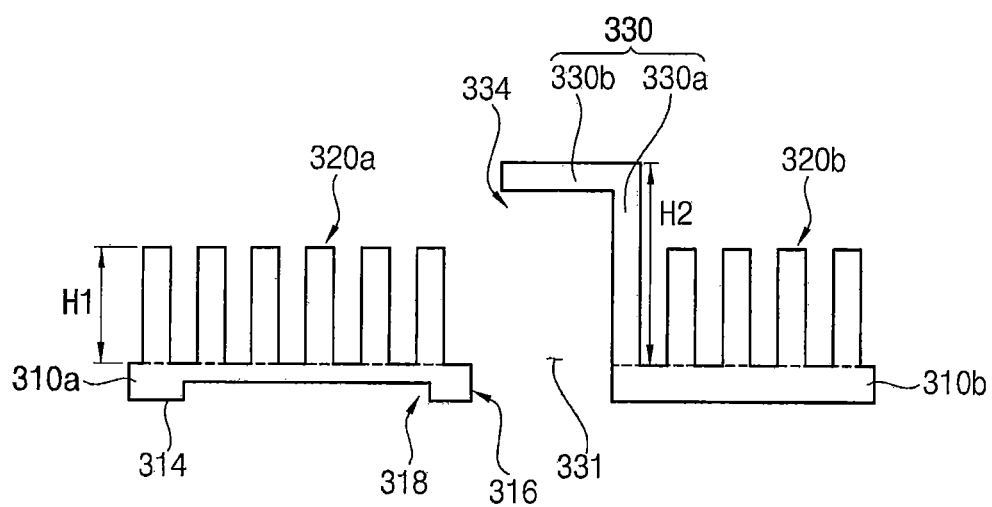

Referring to FIG. 14, a first group of radiation fins 320a may be disposed on a first base 310a and a second group of radiation fins 320b may be disposed on a second base 310b. A pocket cover 330 may extend upwardly from an opening 316 formed between the first base 310a and the second base 310b. The pocket cover 330 may be positioned between the first group of radiation fins 320a and the second group of radiation fins 320b. An upper surface of the first base 310a may be coplanar with an upper surface of the second base 310b.

The radiation fins 320a may have a first height H1 from the upper surface of the first base 310a, and the pocket cover 330 may have a second height H2 greater than the first height H1.

Figure 15:
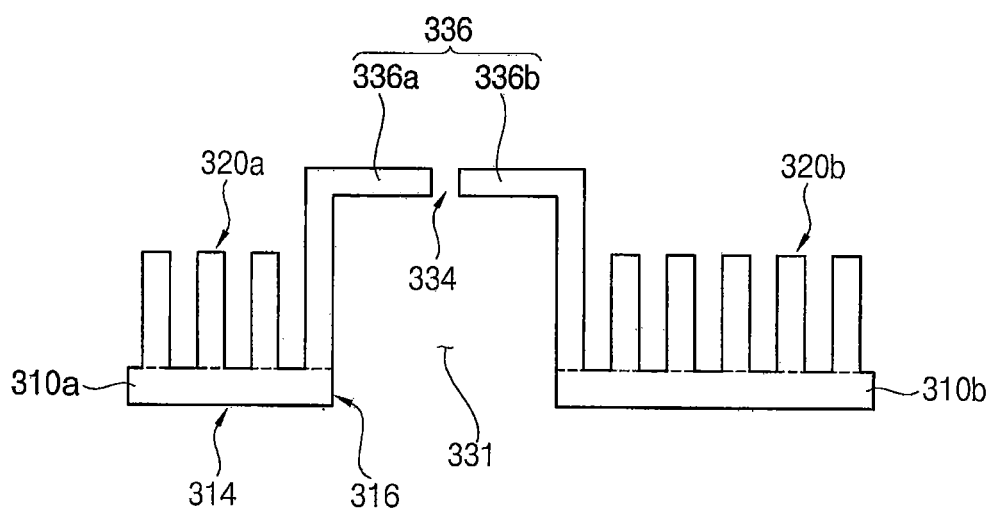

Referring to FIG. 15, a first group of radiation fins 320a may be disposed on a first base 310a and a second group of radiation fins 320b may be disposed on a second base 310b. A pocket cover 336 may extend upwardly from an opening 316 formed between the first base 310a and the second base 310b.

The pocket cover 336 may include a first cover portion 336a extending upwardly from the first base 310a and a second cover portion 336b extending upwardly from the second base 310b. An upper end portion of the first cover portion 336a and an upper end portion of the second cover portion 336b may be spaced apart from each other to form an open slit 334.

Figure 16:
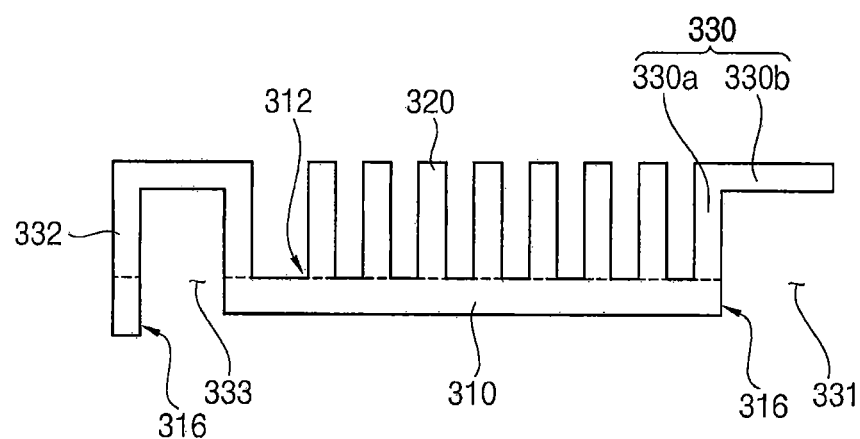

Referring to FIG. 16, an opening 316 may be may be formed in the outermost region of a base plate 310. A first pocket cover 330 may include a vertical extending portion 330a extending upwardly from the opening 316 and a horizontal extending portion 330b extending horizontally from the vertical extending portion 330a. The vertical extending portion 330a and the horizontal extending portion 330b may form a first receiving space 331 connected to the surrounding environment.

Figure 17:
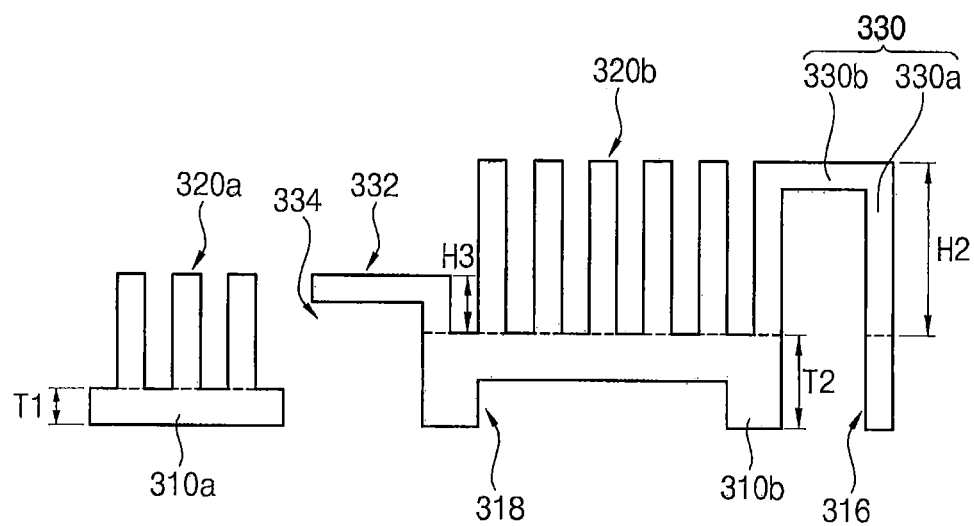

Referring to FIG. 17, a first base 310a may have a first thickness T1 and a second base 310b may have a second thickness T2 greater than the first thickness T1. A first pocket cover 330 may have a second height H2 from an upper surface of the second base 310b and a second pocket cover 332 may have a third height 113 less than the second height H2 from the upper surface of the second base 310b.

Figure 18:
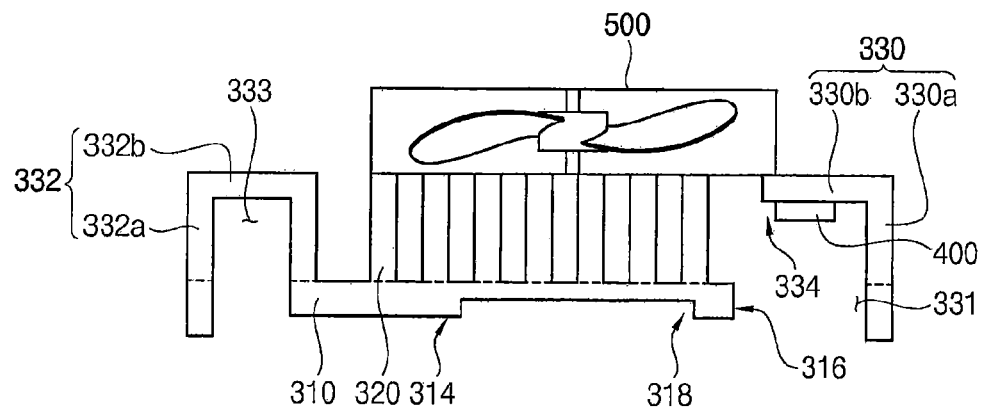

Referring to FIG. 18, a heat sink may further include a cooling fan 500 disposed on radiation fins 320. The cooling fan 500 may cover an open slit 334 of a first pocket cover 330. The cooling fan 500 may generate an air flow which passes through gaps between the radiation fins 320 and through the open slit 334 of the first pocket cover 330, thereby improving heat dissipation.

Figure 19:
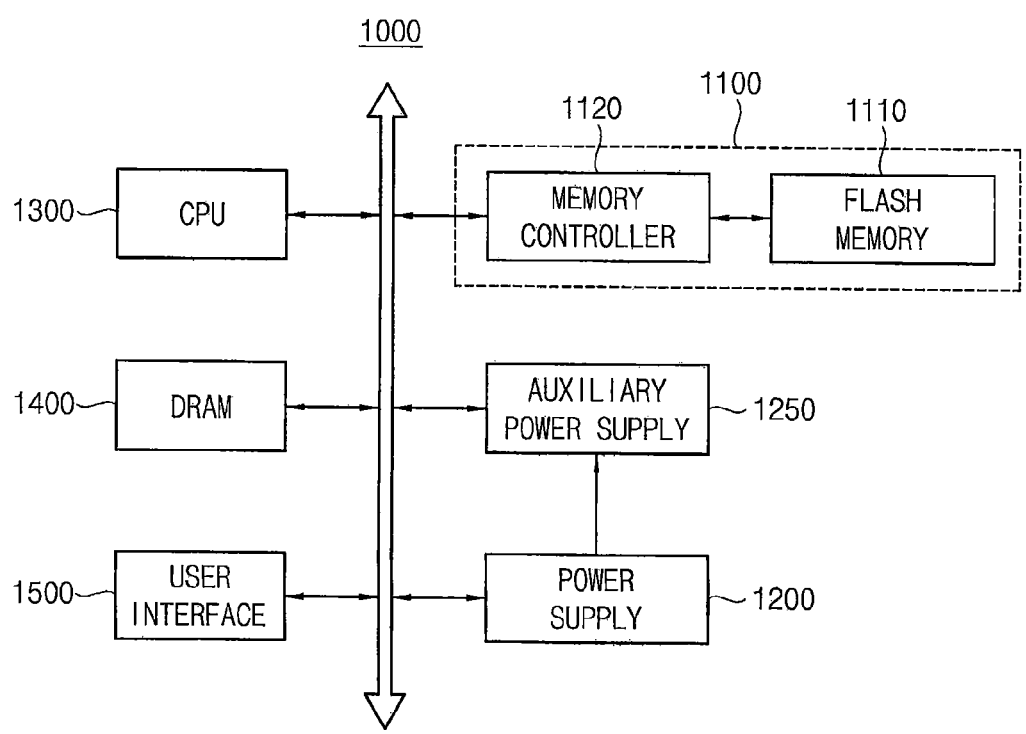

FIG. 19 is a block diagram illustrating an electronic device in accordance with example embodiments.

Referring to FIG. 19, an electronic device 1000 may include a memory system 1100, a power supply 1200, an auxiliary power supply 1250, a central processing unit (CPU) 1300, DRAM 1400, and a user interface 1500. The memory system 1100 may include a flash memory 1110 and a memory controller 1120. The memory system 1100 may be embodied as the SSD according to example embodiments. The electronic device 1000 may be embodied by a personal computer PC or a portable electronic device such as a notebook, a cell phone, a personal digital assistant (PDA) and a camera.

The memory module according to example embodiments may be applied to a card-type SSD, however, it may not be limited thereto, and the memory module may be embodied as a card-type memory module having a plurality of memory devices.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A heat sink for a memory module, the heat sink comprising:
    a thermally conductive base plate configured to be mounted on a module board;
    a plurality of radiation fins protruding outwardly from the base plate; and
    a pocket cover extending outwardly from an opening formed in the base plate, wherein the pocket cover covers a passive device, on the module board, that protrudes through the opening, wherein the pocket cover comprises:
        a first portion extending from an upper surface of the base plate and configured to cover a side surface of the passive device; and
        a second portion extending orthogonally from the first portion and configured to cover a top surface of the passive device.

2. The heat sink of claim 1, wherein the pocket cover has an opening that exposes a space beneath the pocket cover to a surrounding environment.

3. The heat sink of claim 1, wherein a recessed portion is formed in a lower surface of the base plate and is configured to cover an upper portion of a semiconductor device mounted on the module board.

4. The heat sink of claim 1, wherein a height of the pocket cover from an upper surface of the base plate is the same as a height of the radiation fins.

5. The heat sink of claim 1, further comprising a cushion pad on an inner surface of the pocket cover that is configured to contact the passive device and cushion the passive device from impact.

6. The heat sink of claim 1, wherein the radiation fins extend in a first direction and the pocket cover extends in a direction parallel with the first direction.

7. The heat sink of claim 1, wherein the base plate comprises a threaded receptacle configured to receive a fastener therein for securing the heat sink to the module board.

8. The heat sink of claim 1, wherein the base plate comprises a guide pin that facilitates alignment of the heat sink with the module board.

9. The heat sink of claim 1, wherein the memory module is a card-type solid state drive.

10. A memory module, comprising:
    a module board;
    at least one semiconductor device and at least one passive device mounted on the module board; and
    a heat sink thermally coupled to the module board, the heat sink comprising:
        a thermally conductive base plate covering the module board;
        a plurality of radiation fins protruding outwardly from the base plate; and
        a pocket cover extending outwardly from an opening formed in the base plate, wherein the opening corresponds to a location of the at least one passive device on the module board, wherein the pocket cover is configured to cover the at least one passive device that protrudes through the opening, and wherein the pocket cover comprises:
            a first portion extending from an upper surface of the base plate and configured to cover a side surface of the at least one passive device; and
            a second portion extending orthogonally from the first portion and configured to cover a top surface of the at least one passive device.

11. The memory module of claim 10, wherein the pocket cover comprises an opening that exposes a space beneath the pocket cover to a surrounding environment.

12. The memory module of claim 10, wherein a recessed portion is formed in a lower surface of the base plate and is configured to cover an upper portion of the semiconductor device.

13. The memory module of claim 10, wherein the heat sink further comprises a cushion pad on an inner surface of the pocket cover that is configured to contact the at least one passive device and cushion the at least one passive device from impact.

14. A memory module, comprising:
    a module board; and
    a heat sink comprising:
        a thermally conductive base plate configured to be mounted to the module board;

a first plurality of radiation fins protruding outwardly from a first portion of the base plate;

a second plurality of radiation fins protruding outwardly from a second portion of the base plate; and a pocket cover extending outwardly from an opening formed in the base plate between the first and second portions of the base plate, wherein the pocket cover is configured to cover a passive device, on the module board, that protrudes through the opening.

15. The memory module of claim 14, wherein a height of the pocket cover from an upper surface of the base plate is greater than or equal to a height of the first and second plurality of radiation fins.

16. The memory module of claim 14, wherein a height of the pocket cover from an upper surface of the base plate is less than a height of the first and second plurality of radiation fins.

17. The memory module of claim 14, wherein a height of the first plurality of radiation fins from an upper surface of the base plate is different from a height of the second plurality of radiation fins from the upper surface of the base plate.

18. The memory module of claim 14, wherein a recessed portion is formed in a lower surface of at least one of the base plate first and second portions and is configured to cover an upper portion of a semiconductor device on the module board.

* * * * *